(12) United States Patent
Makimura

(10) Patent No.: US 6,818,908 B2
(45) Date of Patent: Nov. 16, 2004

(54) DEVICE AND METHOD FOR OPTICAL PROCESSING FOR PROCESSING INORGANIC TRANSPARENT MATERIAL BY OPTICAL PATTERNING

(76) Inventor: Tetsuya Makimura, 126-203, Namiki 2-chome, Tsukuba-shi, Ibaraki, 305-0044 (JP)

( * ) Notice: Subject to any disclaimer, the term of this patent is extended or adjusted under 35 U.S.C. 154(b) by 0 days.

(21) Appl. No.: 10/478,531
(22) PCT Filed: Nov. 12, 2002
(86) PCT No.: PCT/JP02/11813
§ 371 (c)(1),
(2), (4) Date: Nov. 20, 2003
(87) PCT Pub. No.: WO03/045617
PCT Pub. Date: Jun. 5, 2003

(65) Prior Publication Data
US 2004/0155203 A1 Aug. 12, 2004

(30) Foreign Application Priority Data
Nov. 29, 2001 (JP) ........................................ 2001-365320

(51) Int. Cl.[7] ................................................ A61N 5/00
(52) U.S. Cl. ........................................ 250/492.2; 219/6
(58) Field of Search .................. 250/492.2; 219/121.68, 219/121.67, 121.6, 121.69, 121.72, 121.83; 364/479.05, 474.08

(56) References Cited

U.S. PATENT DOCUMENTS

2004/0118448 A1 * 6/2004 Scher et al. ................. 136/252

FOREIGN PATENT DOCUMENTS

JP            10006046 A * 1/1998 ........... B23K/26/00

* cited by examiner

*Primary Examiner*—Nikita Wells
*Assistant Examiner*—Erin-Michael Gill
(74) *Attorney, Agent, or Firm*—Knobbe, Martens, Olson & Bear LLP

(57) ABSTRACT

Discloses a photo machining apparatus and a photo-fabrication method to perform two-dimensional or three-dimensional fabrication of an inorganic transparent material with a precision of 10 nm. Soft X-ray (2) emitted from a soft X-ray source (1) is focally applied by an optical system 3 comprising a combination of a concave mirror and convex mirrors onto an inorganic transparent material (4) in a predetermined pattern to generate new absorption in a irradiated region of the inorganic transparent material, which is then irradiated with a machining laser beam (5) so that a visible or ultraviolet machining laser beam (5) having a high energy density is absorbed exclusively in the part of the patterned inorganic transparent material (4) to fabricate the inorganic transparent material (4).

21 Claims, 3 Drawing Sheets

(a)

(b)

DEVICE AND METHOD FOR OPTICAL PROCESSING FOR PROCESSING INORGANIC TRANSPARENT MATERIAL BY OPTICAL PATTERNING

This application is the U.S. National Phase under 35 U.S.C. §371 of International Application PCT/JP02/11813, filed Nov. 12, 2002, which claims priority to JP 2001-365320, filed Nov. 29, 2001. The International Application was not published under PCT Article 21(2) in English.

FIELD OF THE INVENTION

The present invention relates to extensively applicable photo machining apparatus and photo machining methods for machining inorganic transparent materials nanometrically (with a precision on the order of up to several nanometers). They are used, for example, in the field related to optically functional parts such as photonic crystals and optical waveguides, and microchip chemistry such as DNA analyses and blood tests.

BACKGROUND OF THE ART

Inorganic transparent materials are highly valued for use in the fields of optical materials, such as photonic crystals and optical waveguides, and nanometric chemical analyses and chemical reactions in medicine and biotechnology, and accordingly, highly precise and less costly techniques for the fabrication and modification of inorganic transparent materials are in demand.

A technique called laser ablation, in which a material is strongly irradiated with a laser beam and the irradiated surface is fabricated by ablation, has already been used practically in metal fabrication using carbon dioxide gas laser. The most advanced photo machining technology in terms of nanometric precision is represented by photo lithography, in which the machining precision is limited by the wavelength of laser light used for machining and is on the order of about 100 nm at the best. In order to perform finer machining, use of the light with a wavelength of 10 nm, namely soft X-ray, is necessary, which increases the machining cost.

Further, it is difficult to fabricate inorganic transparent materials by conventional photo machining techniques because the inorganic transparent materials are transparent and do not absorb laser light.

Conventional techniques already known as photo machining techniques for inorganic transparent materials are described as follows.

(1) A technique to perform laser machining by immersing a material to be machined in a photosensitizing medium solution has been reported but the machining precision has not reached on the order of the wavelength.

(2) It is reported that when laser plasma produced by laser ablation is brought into contact with the surface of a material to be machined and then this surface is irradiated with laser light for machining, the material to be machined is ablated by the plasma which absorbs its energy. However, also in this technique, the machining precision has not reached on the order of the wavelength.

(3) It is reported that when silicon dioxide is irradiated with an F2 laser beam, absorption is generated in the state originated from non-crystality and modification can be performed by simultaneous irradiation of a strong KrF (krypton fluoride) laser beam in this state. This technique cannot be extensively used because of a prerequisite that the state of the first laser beam absorption is present in advance.

(4) Absorption can occur even with a transparent material by irradiating a material to be machined with a femtosecond laser beam for multi-photon absorption, in which multiple photons are simultaneously absorbed, and thereby fabrication such as ablation and modification can be performed; however, the machining precision is on the order of the wavelength.

(5) It is reported that interference generated between two beams of femtosecond laser light on the surface of a material to be machined allows ablation with the interference pattern of several nanometers. However, patterns that can be ablated are limited.

The present invention is to provide extensively applicable fabrication techniques to machine inorganic transparent materials at a precision on the order of up to 10 nm without problems associated with conventional fabrication techniques.

DISCLOSURE OF THE INVENTION

In order to solve the abovementioned problems, the present invention provides a photo machining apparatus comprising a patterning light source to emit ultraviolet light or soft X-ray, a patterning irradiation means, and a machining laser beam source, characterized in that said patterning irradiation means is to irradiate an inorganic transparent material with said patterning light in a predetermined pattern matching to a shape to be machined and then generate new light absorption in a part of said inorganic transparent material irradiated with said patterning light in said predetermined pattern, and said machining laser beam source is to irradiate said inorganic transparent material with a machining laser beam to allow said machining laser beam to be absorbed only at the part of said inorganic transparent material where said absorption is generated, thereby machining said inorganic transparent material.

The abovementioned patterning light source is characterized in that it emits a light with a wavelength from a ultraviolet light to soft X-ray, which has a photon energy higher than the bandgap of said inorganic transparent material, a photon energy corresponding to excitation to the tail state, or a photon energy corresponding to the energy for direct excitation of the excitons.

The abovementioned patterning irradiation means is characterized in that it is a means to perform patterning by focusing beams on the inorganic transparent material using a beam-focusing optical system and then scanning a stage which supports the inorganic transparent material.

The abovementioned patterning irradiation means is characterized in that it is a means to scan and irradiate said inorganic transparent material with a patterning light via a scanning mirror in accordance with said pattern.

The abovementioned patterning irradiation means is characterized in that it is a means to transcribe said pattern onto said inorganic transparent material using an imaging optical system.

The abovementioned patterning irradiation means is characterized in that it is a means to arrange a contact mask on the surface of an inorganic transparent material and irradiate said inorganic transparent material with a patterning light through the slit of the contact mask.

The abovementioned patterning light source is characterized in that it is a debris-free laser plasma soft X-ray using gas as a target.

In order to solve the abovementioned problems, the present invention provides a method for photo machining characterized in that an inorganic transparent material is irradiated with a patterning light in a predetermined pattern matching to a shape to be machined to generate new light absorption and the inorganic transparent material is simultaneously irradiated with a machining laser beam so that machining is performed by allowing said machining laser beam to be absorbed only in a part of said inorganic transparent material where the absorption is generated in said predetermined pattern.

According to the present invention comprising the abovementioned structure, the absorption in the ultraviolet or visible region can be generated by transiently patterning an inorganic transparent material with soft X-ray having a high spatial resolution of up to about 10 nm, and then only the patterned part of the inorganic transparent material can be machined by further irradiation of a machining laser beam having a wavelength matching to said absorption that can maintain a high energy density, although it is difficult to maintain the high energy density in terms of cost and technology.

BEST MODE FOR CARRYING OUT THE INVENTION

Figure 1:
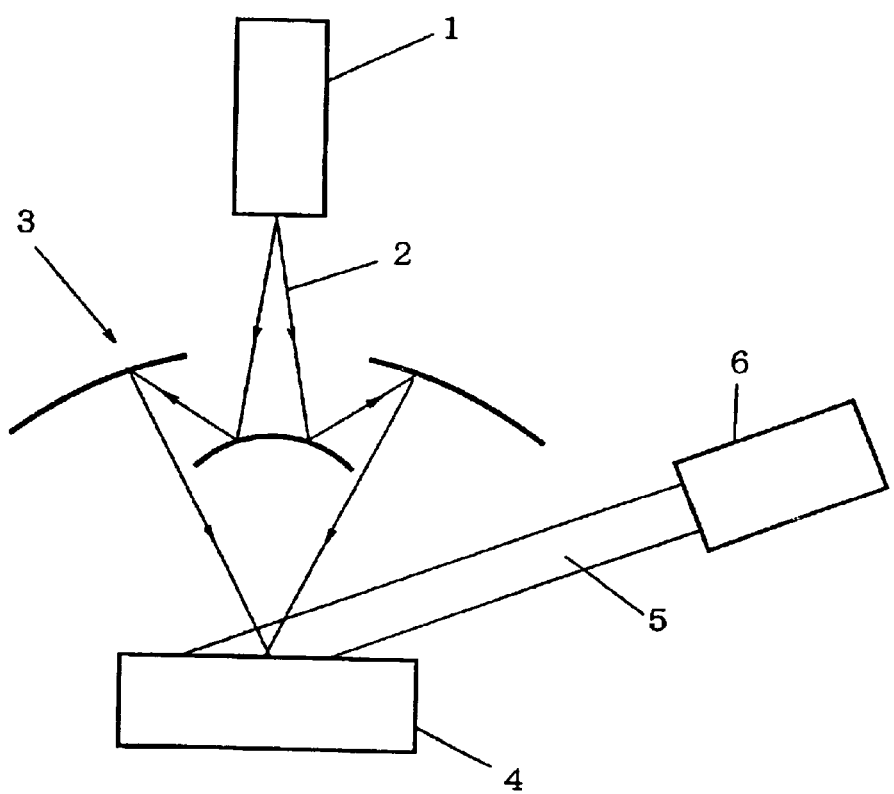
FIG. 1 is to explain the basic structure of the apparatus and methods of the present invention.

Modes for embodying the photo machining apparatus and photo machining methods to fabricate inorganic transparent materials according to the present invention are to be explained based on examples referring to drawings.

The present invention comprises a photo machining apparatus and a photo machining method to fabricate an inorganic transparent material at a precision of 10 nm. First, the basic principle of the invention is to be explained. An inorganic transparent material cannot be fabricated by direct irradiation of a laser beam because of its transparency that interferes with light absorption. Moreover, machining precision is limited to on the order of the wavelength when fabrication is attempted by using the abovementioned conventional methods.

The prevent invention utilizes a phenomenon that a structure change or a lattice rearrangement occurs so as to allow the visible or ultraviolet light to be absorbed only at an irradiated part when an inorganic transparent material to be machined is irradiated with a patterning light having a photon energy higher than the bandgap. Namely, when a material is irradiated with light having a photo energy higher than the bandgap, a pair of an electron and a positive hole is produced and they bind each other by Coulomb force. Such state of the material is called by a term "exciton."

In an inorganic transparent material, more specifically in an ion-binding material, an exciton is produced immediately after the patterning light irradiation, and then immediately localized in an area of about one lattice constant with nanometric local lattice rearrangement. This localized exciton is specifically called self-trapped exciton. Machining precision can be ensured by this localization.

The exciton has optical absorption due to the bound state by Coulomb force. This corresponds to the optical absorption from the 1s state to the 2p state of a hydrogen atom. This optical absorption occurs responding to the light having a photon energy smaller than the bandgap. In particular, the difference is great with the self-trapped exciton. This means that new optical absorption is generated in the visible to ultraviolet wavelength region, which is originally transparent, in an inorganic transparent material. In this way, the absorption takes place with a machining laser beam of a longer wavelength of from the visible to ultraviolet region, which is advantageous in terms of cost and stability, so that fabrications (e.g., ablation, cutting) and modifications can be easily performed.

The abovementioned absorption of the self-trapped exciton takes place only in a part irradiated with a patterning light; therefore, it is significant that the machining with a precision on the order of the wavelength of soft X-ray can be achieved using a machining laser beam having a long wavelength. Further, the abovementioned two characteristics of the self-trapped exciton, namely being localized and generating new absorption, are features common to all ion-binding materials, and accordingly the present invention can be most extensively used.

Further, the abovementioned generation of the self-trapped exciton is a transient phenomenon and the original state can completely be recovered thereafter in many inorganic transparent materials, as typically seen with silicon dioxide. Therefore, an area not irradiated with a machining laser beam is neither fabricated nor deteriorated. Time required for this recovery is temperature dependent. Accordingly, the efficiency can be improved by performing the machining at a low temperature, for example, at the temperature of liquid nitrogen or liquid helium.

The present invention utilized the abovementioned principles; first an inorganic transparent material is irradiated with a patterning light in a pattern matching to a predetermined shape. In this specification, the means for this irradiation is referred to as "patterning irradiation means." More specifically, a scanning stage, an optical system, and a contact mask can be used as described below. Using this patterning irradiation means, an inorganic transparent material is irradiated with a patterning light to generate exciton absorption in a predetermined pattern.

Next, this inorganic transparent material is irradiated with a machining light adjusted to the wavelength of the exciton absorption to perform fabrications (e.g., ablation and cutting) or modifications of the patterned region.

FIG. 1 explains the basic structure of the apparatus and method of the present invention. A patterning light 2 is emitted from a patterning light source 1, focused by an optical system 3 comprising a combination of a concave mirror and convex mirrors, and then applied onto an inorganic transparent material 4. Simultaneously, the inorganic transparent material 4 is irradiated with a machining laser beam 5 having a high energy density emitted from a machining laser 6. In this way, this visible or ultraviolet machining laser beam 5 is absorbed exclusively in a part where transient absorption is generated in the predetermined pattern in the inorganic transparent material 4, and thereby fabrications (e.g., ablation and cutting) or modifications of the inorganic transparent material 4 can be performed.

Further, as explained above, an inorganic transparent material is irradiated with a patterning light so as to be patterned in a pattern matching to a predetermined shape to be machined using a patterning irradiation means, and specifically, the following systems can be devised as a patterning irradiation means.

(1) A material to be machined is irradiated with a focused beam of patterning light and then scanning is carried out over a stage on which the inorganic transparent material is placed for patterning.

(2) An inorganic transparent material is irradiated with a focused beam of patterning light via a scanning mirror or the like and patterning is performed by scanning.

(3) A contact mask is placed on the surface of an inorganic transparent material and patterning irradiation is carried out with a patterning light through the slit of this contact mask.

(4) A predetermined pattern is transcribed by an imaging optical system.

EXAMPLE

Figure 2:
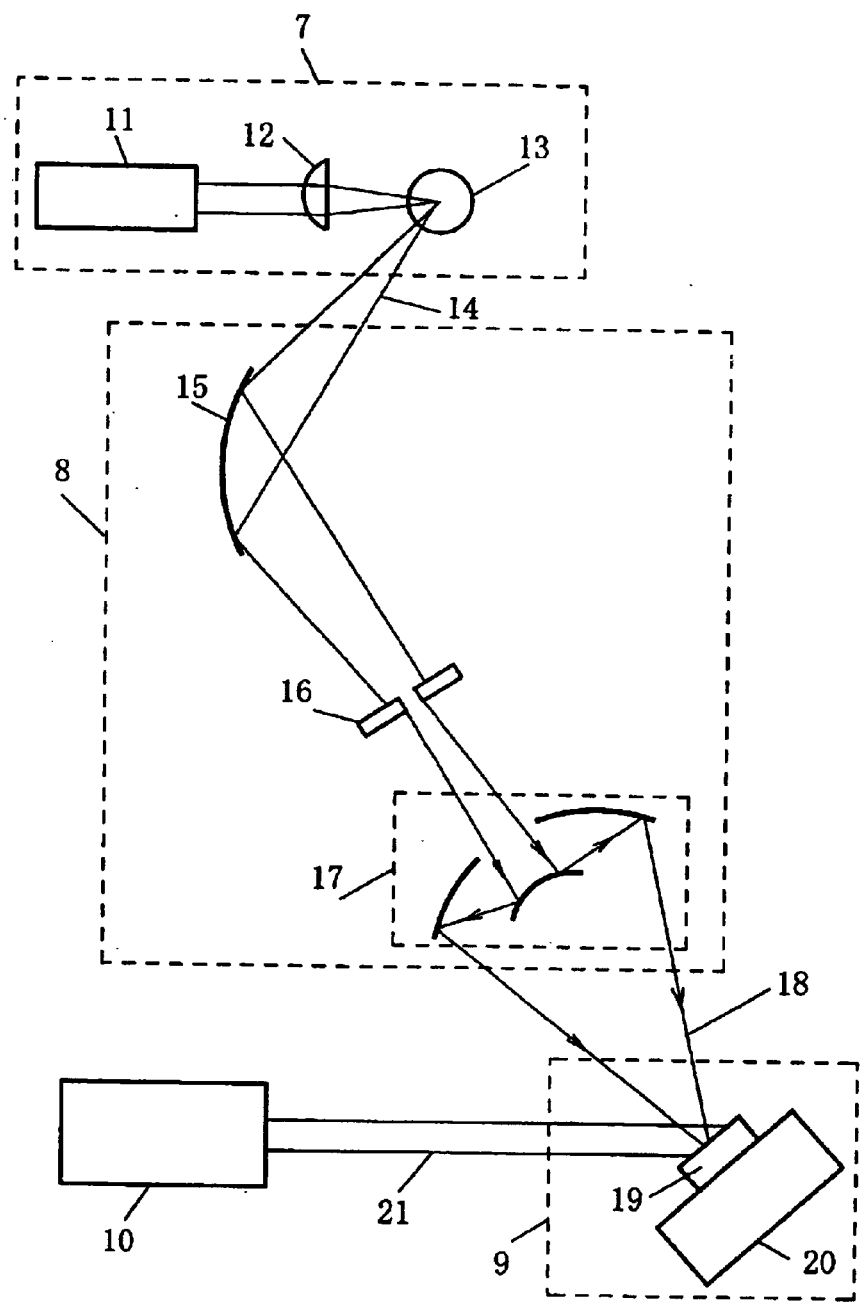
FIG. 2 is to explain an example of the present invention.

FIG. 2 explains an example of a photo machining apparatus and photo machining method to machine an inorganic transparent material according to the present invention. This example is an apparatus and method to irradiate the surface of an inorganic transparent material with laser plasma soft X-ray in a required pattern, in which a master pattern is transcribed by an imaging optical system or focusing optical system.

An apparatus in this example comprises a patterning light source section 7, a patterning irradiation means section 8, a sample section 9, and a machining laser 10. The patterning light source section 7 is a laser plasma soft X-ray source section, and a Xe cluster target 13 is focally irradiated with a laser beam from a femtosecond laser 11 using a focusing optical system 12 to generate laser plasma soft X-ray 14.

In the patterning irradiation means 8, this laser plasma soft X-ray 14 is focused on a master pattern 16 using a toroidal mirror 15, and the resulting pattern is introduced into the sample section 9 as a patterning light 18 by an optical system 17 comprising a combination of concave mirrors and a convex mirror. An inorganic transparent material 19 placed on a stage (support) 20 is patterned and irradiated with the patterning light 8 and thereby transient absorption is generated in the inorganic transparent material 19 in accordance with the predetermined pattern.

Further, in FIG. 2, patterning can be performed by a setup in which a master pattern comprising pin holes not shown in the figure is used as the master pattern 16, an inorganic transparent material 19 is irradiated with a focused beam using a focusing optical system as the optical system 17, and scanning is carried out using the stage 20 supporting the inorganic transparent material 19 as a mobile scanning stage.

Also, in FIG. 2, patterning can be performed using an imaging optical system as the optical system 17, in which the inorganic transparent material 19 is pattern-irradiated in accordance with the pattern of the master pattern.

On the other hand, the inorganic transparent material 19 irradiated with the patterning light 18 is irradiated with a machining laser beam 21 from a machining laser 10. This machining laser beam 21 can be a visible or ultraviolet laser beam having a high energy density, and when irradiated with this machining laser beam, the machining laser beam 21 is absorbed in a part where transient absorption is generated in the above-mentioned predetermined pattern in the inorganic transparent material 19, and thereby fabrications (e.g., ablation and cutting) or modifications can be performed.

For example, silicon dioxide glass is used as the inorganic transparent material 19 to be machined. When silicon dioxide having itself a bandgap of greater than 8 eV is irradiated with the patterning light 18 of soft X-ray of about 10 nm by the apparatus of FIG. 2, self-trapped exciton is produced, which allows the absorption of ultraviolet light of 3 eV (400 nm) for $1\mu$ second after the soft X-ray irradiation, and thereby fabrications (e.g., ablation and cutting) and modifications can be performed.

In the patterning light source section 7 in FIG. 2, the laser plasma soft X-ray 14 is generated as described above. This laser plasma soft X-ray 14 is emitted from laser plasma which is generated by irradiating a target 13 with a laser beam from a femtosecond laser 11. A solid can be used as the target 13. A specific example of such structure is explained below referring to FIG. 3(a).

Figure 3:
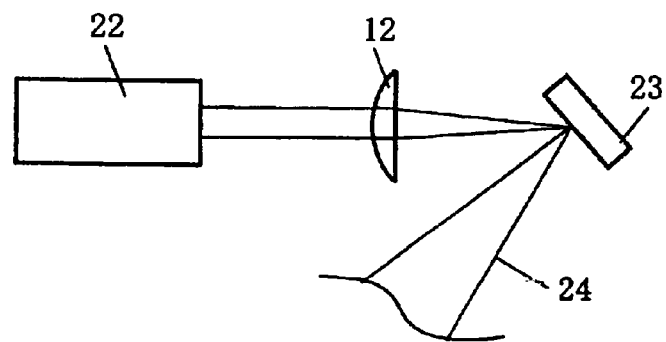
FIGS. 3(a) and (b) are schematic drawings to each explain technically developed examples of the present invention.
Figure 3:
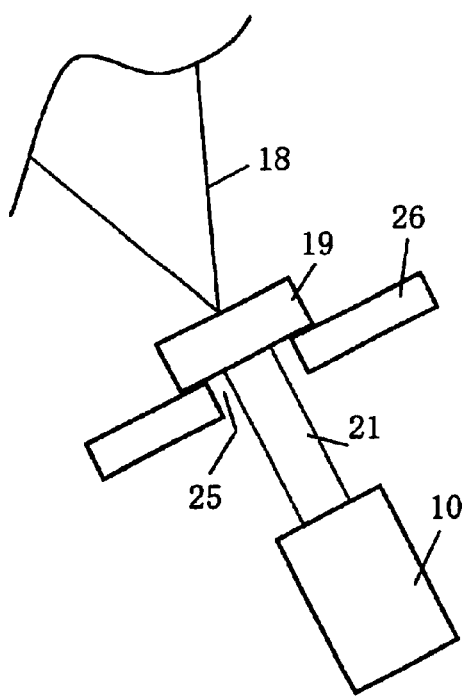

FIG. 3(a) is a schematic view in which a laser plasma soft X-ray light source is used as the patterning light source section. In this laser plasma soft X-ray light source, a laser beam from a laser 22 is focused by an optical system 12, the target 23 is irradiated with this focused beam to generate plasma, and soft X-ray 24 emitted from the laser plasma is utilized. Examples of the laser 22 to be used include an excimer laser, Nd:YAG laser, and (Ti sapphire) femtosecond laser. As the target 23, a solid target such as tin, tantalum and hafnium, is used.

However, when a solid target is used, debris is released from the target when irradiated with the laser light. Here, the debris is a liquid droplet having a size of about 1 $\mu$m. This dirties optical parts for the soft X-ray, which may practically cause a problem.

Thus, an invention of an apparatus using a Xe cluster target instead of a solid target is disclosed in Japanese Patent Laid-open Application No. H2001-68296. In this case, a laser plasma soft X-ray source is provided by focusing a femtosecond laser beam from a laser light source onto a Xe (xenon) cluster target for irradiation. As a result, highly luminescent soft X-ray of less than 2.5 nm and 500 eV or higher is obtained from the plasma thus produced.

The soft X-ray source according to the abovementioned invention previously applied is a debris-free laser plasma soft X-ray source for practical use. By utilizing the debris-free laser plasma soft X-ray obtained using this laser plasma soft X-ray source as a soft X-ray source of the present invention, concave mirrors and the like in the optical system 15, 17 can be prevented from getting dirt to make them maintenance-free.

In FIG. 2, the machining laser beam 21 is projected into the inorganic transparent material 19 from the same side (the front side) as the patterning light 18. However, it is not necessary to be projected from the front side since the machining laser beam 21 passes through the part where no absorption is generated with the patterning light 18.

FIG. 3(b) is a schematic drawing showing an example in which the machining laser beam 21 is projected not onto the front side irradiated with the patterning light 18 but onto the back side of the inorganic transparent material 19. In FIG. 3(b), the inorganic transparent material 19 placed on a stage 26 having a penetration hole 25 is irradiated with the machining laser beam 21 from the machining laser 10 installed on the back side.

Furthermore, three-dimensional machining can be performed by controlling the overlap of the machining laser beam 21 with the patterning light 18.

In the present invention, as shown in FIGS. 1 and 2 above, machining can be performed by irradiating the patterned part of the inorganic transparent material 4, 19 with the machining laser beam 5, 21 to be absorbed. In this case, the machining can be performed by exposing inclusively a part where absorption is not generated to the machining laser beam 5, 21 or contrastingly, by exposing a part either the same as or narrower than the patterned part to the machining laser beam 5, 21.

According to the present invention comprising the structure described above, using a photo fabrication apparatus and a photo fabrication method of the present invention, the absorption in the ultraviolet or visible region can be generated by transiently patterning an inorganic transparent material using soft X-ray having a high spatial resolution of up to about 10 nm, and then only the patterned area of the inorganic transparent material can be machined by further irradiation with a machining laser beam having a wavelength matching to the abovementioned absorption that can maintain a high energy density.

Embodiment of the photo machining apparatus and the photo machining methods according to the present invention are explained above based on the examples; however, the invention is not limited by these particular examples and it is understood that various embodiments are possible within the scope of techniques described in the claims. Further, the invention is referred to machining of inorganic transparent materials above; however, it is understood that the invention is also applicable for the machining of non-transparent materials.

INDUSTRIAL APPLICABILITY

According to the present invention comprising the structure described above, the absorption in the ultraviolet or visible region can be generated by transiently patterning an inorganic transparent material with soft X-ray having a high spatial resolution of up to about 10 nm, and then only the patterned region of the inorganic transparent material can be machined by further irradiation with a machining laser beam having a wavelength matching to the abovementioned absorption that can maintain a high energy density.

Since the present invention has the abovementioned structure and effect, the photo machining apparatus and the photo machining method according to the present invention are utilized, for example, in the field related to optically functional parts such as photonic crystals and optical waveguides, and microchip chemistry such as DNA analyses and blood tests.

What is claimed is:

1. A photo machining apparatus comprising a patterning light source, a patterning irradiation means, and a machining light source, characterized in that said patterning light source is to emit light having a wavelength short enough for an inorganic transparent material to substantially generate light absorption, said patterning irradiation means is to irradiate the inorganic transparent material with said patterning light in a predetermined pattern matching to a shape to be machined, produce localized excitons in only the part where said inorganic material is irradiated with said patterning light in said predetermined pattern, and then generate new light absorption originated from said excitons, and said machining laser beam source is to irradiate said inorganic transparent material with a machining laser beam to allow said machining laser beam to be absorbed only in the part of said inorganic transparent material where said absorption is generated, thereby machining said inorganic transparent material.

2. The photo machining apparatus according to claim 1, wherein said patterning light source is to emit a light with a wavelength of the ultraviolet to soft X-ray, which has a photon energy higher than the bandgap of said inorganic transparent material, a photon energy corresponding to excitation to the tail state, or a photon energy corresponding to an energy for direct excitation of the excitons.

3. The photo machining apparatus according to claim 1, wherein said patterning irradiation means is a means to perform patterning by focusing beams on the inorganic transparent material using a beam-focusing optical system and then scanning a stage supporting the inorganic transparent material.

4. The photo machining apparatus according to claim 1, wherein said patterning irradiation means is a means to transcribe said pattern onto said inorganic transparent material using an imaging optical system.

5. The photo machining apparatus according to claim 1, wherein said patterning irradiation means is a means to arrange a contact mask on the surface of an inorganic transparent material and irradiate said inorganic transparent material with a patterning light through the slit of the contact mask.

6. The photo machining apparatus according to claim 1, wherein said patterning irradiation means is a means to scan and irradiate said inorganic transparent material with a patterning light via a scanning mirror in accordance with said pattern.

7. The photo machining apparatus according to claim 1, wherein said patterning light source is a laser plasma soft X-ray source.

8. A photo machining method characterized in that an inorganic transparent material is irradiated with a ultraviolet light or soft X-ray in a predetermined pattern matching to a shape to be machined to generate light absorption and the inorganic transparent material is simultaneously irradiated with a machining laser beam so that machining is performed by allowing said machining laser beam to be absorbed exclusively in a part of said inorganic transparent material where the absorption is generated in said predetermined pattern.

9. The photo machining apparatus according to claim 2, wherein said patterning irradiation means is a means to perform patterning by focusing beams on the inorganic transparent material using a beam-focusing optical system and then scanning a stage supporting the inorganic transparent material.

10. The photo machining apparatus according to claim 2, wherein said patterning irradiation means is a means to transcribe said pattern onto said inorganic transparent material using an imaging optical system.

11. The photo machining apparatus according to claim 2, wherein said patterning irradiation means is a means to arrange a contact mask on the surface of an inorganic transparent material and irradiate said inorganic transparent material with a patterning light through the slit of the contact mask.

12. The photo machining apparatus according to claim 2, wherein said patterning irradiation means is a means to scan and irradiate said inorganic transparent material with a patterning light via a scanning mirror in accordance with said pattern.

13. The photo machining apparatus according to claim 2, wherein said patterning light source is a laser plasma soft X-ray source.

14. The photo machining apparatus according to claim 3, wherein said patterning light source is a laser plasma soft X-ray source.

15. The photo machining apparatus according to claim 4, wherein said patterning light source is a laser plasma soft X-ray source.

16. The photo machining apparatus according to claim 5, wherein said patterning light source is a laser plasma soft X-ray source.

17. The photo machining apparatus according to claim 6, wherein said patterning light source is a laser plasma soft X-ray source.

18. The photo machining apparatus according to claim 9, wherein said patterning light source is a laser plasma soft X-ray source.

19. The photo machining apparatus according to claim 10, wherein said patterning light source is a laser plasma soft X-ray source.

20. The photo machining apparatus according to claim 11, wherein said patterning light source is a laser plasma soft X-ray source.

21. The photo machining apparatus according to claim 12, wherein said patterning light source is a laser plasma soft X-ray source.

* * * * *